(12) United States Patent
Takasu

(10) Patent No.: US 6,489,662 B1
(45) Date of Patent: Dec. 3, 2002

(54) SEMICONDUCTOR INTEGRATED CIRCUIT DEVICE FORMED ON SOI SUBSTRATE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/559,373

(22) Filed: Apr. 27, 2000

(30) Foreign Application Priority Data

May 7, 1999 (JP) .......................................... 11-127028

(51) Int. Cl.$^7$ .................... H01L 29/00; H01L 25/544
(52) U.S. Cl. .................... 257/529; 257/348; 257/359; 257/797
(58) Field of Search .................... 257/209, 250, 257/347, 348, 355, 359, 500, 529, 797; 438/132, 149, 152, 155

(56) References Cited

U.S. PATENT DOCUMENTS

| | | | | |
|---|---|---|---|---|
| 4,021,751 A | * | 5/1977 | Suzuki | 330/253 |
| 4,760,434 A | * | 7/1988 | Tsuzuki et al. | 257/49 |
| 4,774,561 A | * | 9/1988 | Takagi | 257/529 |
| 4,935,801 A | * | 6/1990 | McClure et al. | 257/665 |
| 4,989,057 A | * | 1/1991 | Lu | 257/357 |
| 5,025,298 A | * | 6/1991 | Fay et al. | 257/470 |
| 5,294,975 A | * | 3/1994 | Norman et al. | 356/401 |
| 5,311,061 A | * | 5/1994 | Sheck | 257/797 |
| 5,512,494 A | * | 4/1996 | Tanabe | 438/161 |
| 5,528,372 A | * | 6/1996 | Kawashima | 356/401 |
| 5,538,915 A | * | 7/1996 | Fu | 438/129 |
| 5,801,416 A | * | 9/1998 | Choi et al. | 257/335 |
| 6,002,182 A | * | 12/1999 | Madurawe | 257/797 |
| 6,061,264 A | * | 5/2000 | Giust et al. | 365/96 |
| 6,198,152 B1 | * | 3/2001 | Arai | 257/529 |
| 6,297,124 B1 | * | 10/2001 | New et al. | 438/401 |
| 6,307,273 B1 | * | 10/2001 | Chien et al. | 257/797 |

FOREIGN PATENT DOCUMENTS

JP    4-01-225135    *    9/1989    .................. 257/529

* cited by examiner

Primary Examiner—George C. Eckert, II
(74) Attorney, Agent, or Firm—Adams & Wilks (57) ABSTRACT

A semiconductor integrated circuit device comprises a thin film layer formed on a silicon-on-insulator (SOI) substrate, a laser-trimmable fuse element, a laser trimming positioning pattern for facilitating trimming of the fuse element, a high speed MOS transistor of a complete depletion type, and a high withstand voltage type MOS transistor and an ESD protecting circuit region connected to the high speed MOS transistor to prevent electrostatic breakdown of the thin film layer.

15 Claims, 10 Drawing Sheets

Fig. 1

PRIOR ART

Fig. 2A

PRIOR ART

Fig. 2B

PRIOR ART

SEMICONDUCTOR INTEGRATED CIRCUIT DEVICE FORMED ON SOI SUBSTRATE

BACKGROUND OF THE INVENTION

1. Field of the Invention

The present invention relates to a semiconductor device having a semiconductor integrated circuit formed on an SOI substrate.

2. Description of the Related Art

A semiconductor integrated circuit formed on an SOI substrate is widely known at present. In particular, a high speed MOS transistor has excellent characteristics by utilizing a complete depleting mode in comparison with a MOS transistor formed on a conventional silicon substrate.

Figure 2A:
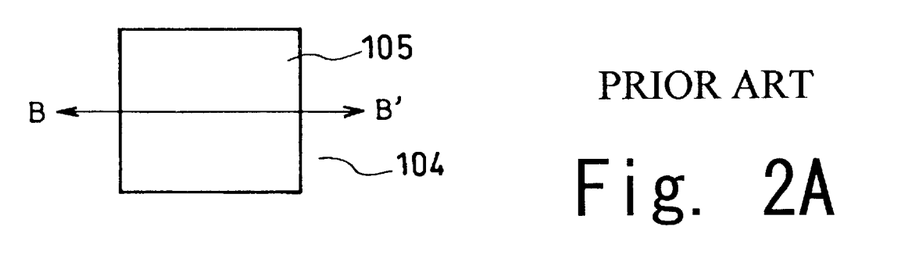
Figure 2B:
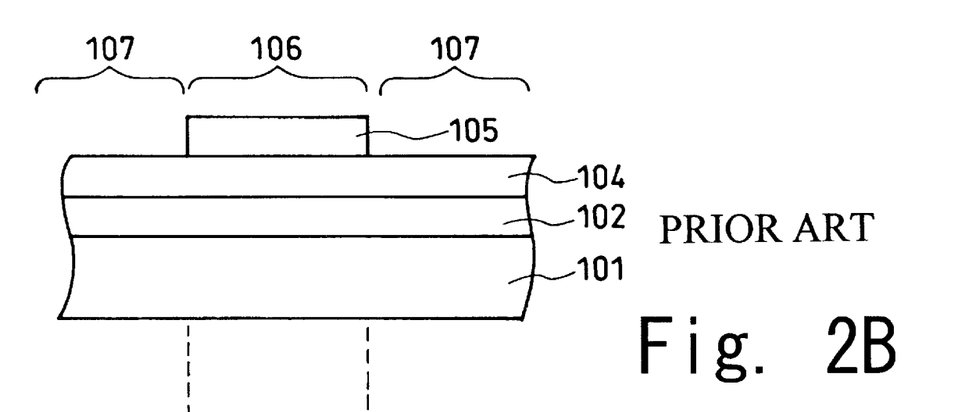
Figure 2C:
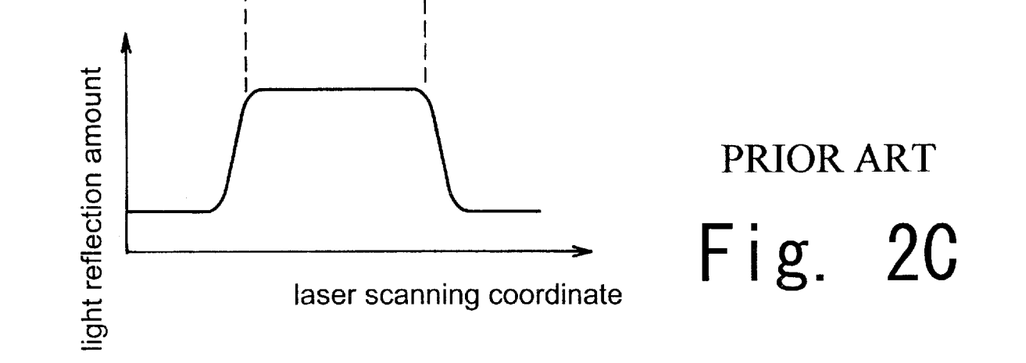
FIG. 2C is a graph showing a light reflection amount along the line B–B' of FIG. 2A.

In contrast to this, there is known a laser trimming method for adjusting analog characteristics in a device of an analog semiconductor integrated circuit. For example, the laser trimming method is described in Japanese Patent Application Laid-open No. Hei 5-13670. In this method, after integrated circuits are two-dimensionally patterned in a semiconductor wafer, electric characteristics of each integrated circuit are measured in a wafer state. Next, a fuse element arranged in one portion of wiring is selected to adjust the analog characteristics and is cut by irradiating a laser beam. The analog characteristics of the integrated circuit can be matched with desired characteristics by selectively cutting the fuse element by such a laser trimming method. A pattern for positioning is arranged on a semiconductor wafer surface to irradiate the laser beam to a predetermined fuse element. FIG. 2A is a plan view of a conventional positioning pattern. FIG. 2B is a cross-sectional view of the conventional positioning pattern. FIG. 2C is a graph showing a change in light reflection amount when this pattern for positioning is scanned along the direction of the line B–B' by the irradiation of the light beam. In the conventional positioning pattern, an outer circumferential portion is composed of a first insulating film 102 formed of a silicon oxide film arranged on a silicon substrate 101 and, a second insulating film 104 formed of a PSG film, etc., and an aluminum film 105 is arranged inside this outer circumferential portion. When the light beam is scanned along a B-direction of FIG. 2A, a light reflecting pattern is obtained as shown in FIG. 2C since reflectivity of the aluminum film 105 is high. A position relation between the positioning pattern and the fuse element formed of a polycrystal silicon film of the integrated circuit is determined at the time of designing. Accordingly, the coordinates of a desired fuse element are calculated by detecting the positioning pattern by the irradiation of the light beam, and the fuse element can be selectively trimmed by irradiating the laser beam at this coordinate place.

However, when a complete depleting mode, in particular, is used in the semiconductor integrated circuit formed on the conventional SOI substrate, the thickness of a monocrystal silicon device forming layer formed on the SOI substrate through a buried oxide film must be set to about 1000 angstroms or less. Accordingly, it is difficult to form a high withstand voltage series element and an ESD protecting element for preventing ESD breakdown (electrostatic breakdown) in the thin monocrystal silicon device forming layer.

Further, no scribe is considered in the semiconductor integrated circuit formed on the conventional SOI substrate. Accordingly, there is a case in which inconveniences such as cracking, breakage, etc., are caused in a dicing process for cutting-out an IC chip.

Figure 8:
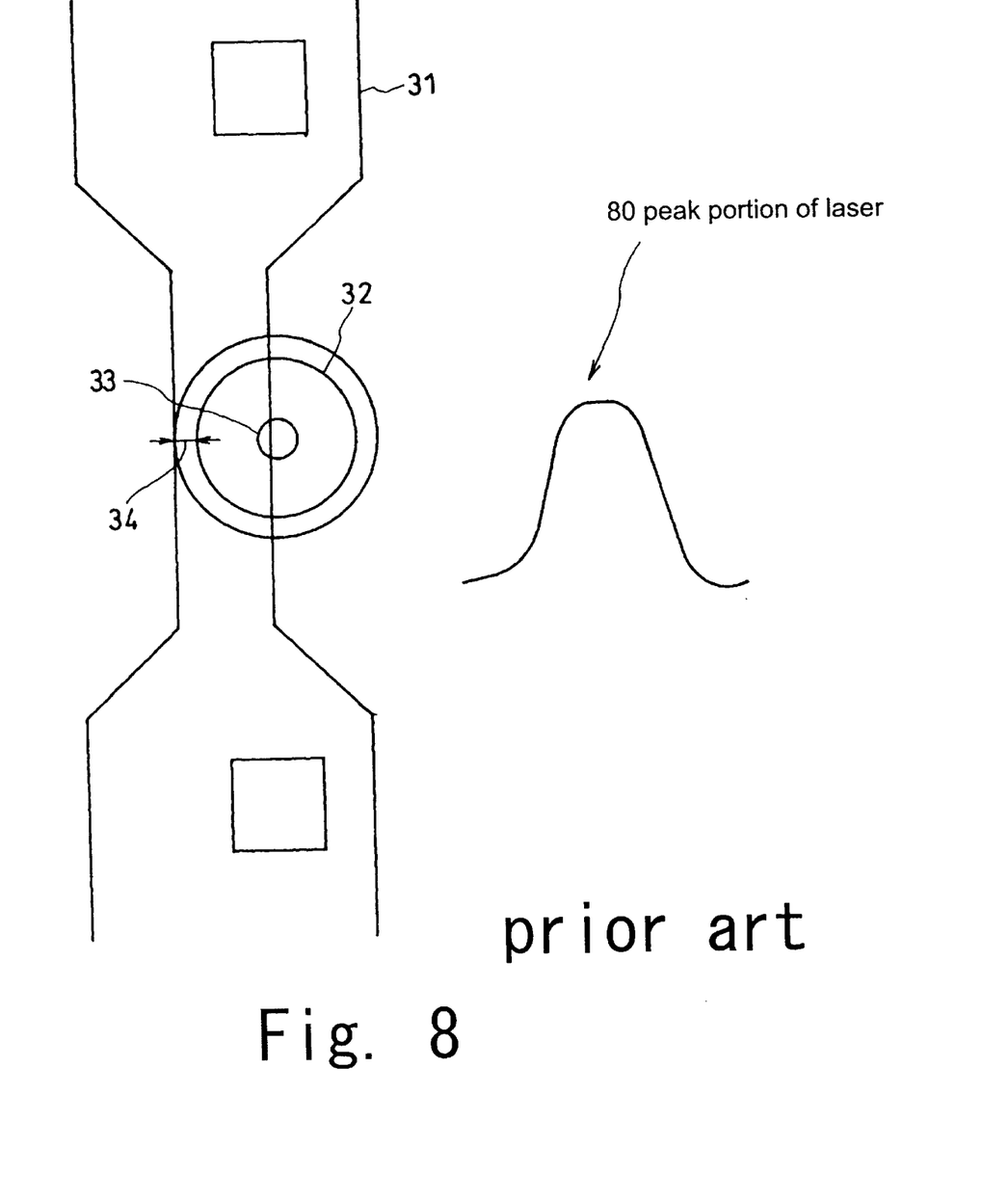
FIG. 8 is a plan view of a fuse element of the conventional semiconductor device.

It is not limited to the IC formed on the SOI substrate but is a general knowledge to form a fuse element of a polycrystal silicon film. However, in the laser trimming, no accurate positioning operation can be performed since the fuse element and the positioning pattern are formed of different thin films. Namely, when the pattern for positioning is detected by a pattern of aluminum and the polycrystal silicon film as the fuse element is laser-trimmed, the position of a laser irradiated region 32 is shifted from the fuse element 31 as shown in FIG. 8. Since an energy distribution in the laser irradiated region 32 corresponds to a Gaussian distribution, an energy intensity is high in a peak portion of a laser 80 but energy intensity in a laser irradiating end portion is low. Accordingly, when there is a large shift in alignment between patterning of the polycrystal silicon film and patterning of the aluminum film in a wafer process, a problem exists in that no fuse element can be stably cut. Reference numerals 33 and 34 respectively designate a burnt portion of a base and a portion left in the fuse cut.

Further, in an analog IC such as a voltage detector, a breeder resistor formed of a plurality of polycrystal silicon resistors is used in many cases. However, it is difficult to obtain the same resistance value in the polycrystal silicon resistors due to an influence of grain. Accordingly, this difficulty has been a serious problem in the manufacture of the analog IC of having high accuracy.

SUMMARY OF THE INVENTION

Therefore, an object of the present invention is to provide a semiconductor device in which an analog IC of high accuracy which mixedly has a high speed MOS transistor of a complete depletion type and a high withstand voltage type MOS transistor is formed on an SOI substrate, so that the semiconductor device is strong against ESD breakdown and cracking, breakage, etc., are prevented in a dicing process.

Further, another object of the present invention is to make a fuse element region compact and reduce cost by improving a positioning accuracy of trimming.

To attain the above objects, the present invention has the following structure.

(1) A semiconductor device in which a fuse element for laser trimming, a pattern for laser trimming positioning, a high speed MOS transistor of a complete depletion type, a high withstand voltage type MOS transistor, an ESD protecting element and a bleeder resistor formed of a plurality of resistors are formed in a semiconductor integrated circuit formed on an SOI substrate.

(2) The semiconductor device as described in the above item (1), in which the pattern for laser trimming positioning is composed of a high light reflectivity region and a low light reflectivity region, the high light reflectivity region being formed of a high light reflectivity film formed on a flat base, the low light reflectivity region being formed of the high light reflectivity film formed on a grid, stripe or dot pattern that is for causing diffused reflection of light and is formed of the same thin film as the fuse element for laser trimming.

(3) The semiconductor device as described in the above item (1), in which the fuse element for laser trimming is formed of a monocrystal silicon device forming layer on the SOI substrate.

(4) The semiconductor device as described in the above item (1), in which the high speed MOS transistor of a complete depletion type is formed in the monocrystal silicon device forming layer, and the high withstand voltage type MOS transistor and the ESD protecting element are formed on a silicon substrate from which the monocrystal silicon device forming layer on the SOI substrate and a buried oxide film are removed.

(5) The semiconductor device as described in the above item (1), in which the bleeder resistor is formed of a monocrystal silicon device forming layer.

BRIEF DESCRIPTION OF THE DRAWINGS

In the accompanying drawings:

FIGS. 2A and 2B are diagrams showing a plan view of a pattern for positioning in a conventional semiconductor device and a cross-sectional view of the pattern for positioning in the conventional semiconductor device, respectively, while

FIGS. 3A and 3B are diagrams showing a plan view of a pattern for positioning in a first embodiment of the semiconductor device of the present invention and a cross-sectional view of the pattern for positioning in the first embodiment of the semiconductor device of the present invention, respectively, while

FIGS. 4A and 4B are diagrams showing a plan view of a pattern for positioning in a second embodiment of the semiconductor device of the present invention and a cross-sectional view of the pattern for positioning in the second embodiment of the semiconductor device of the present invention, respectively, while

FIGS. 5A and 5B are diagrams showing a plan view of a pattern for positioning in a third embodiment of the semiconductor device of the present invention and a cross-sectional view of the pattern for positioning in the third embodiment of the semiconductor device of the present invention, respectively, while

FIGS. 7A and 7B are diagrams showing a plan view of a pattern for positioning in a fifth embodiment of the semiconductor device of the present invention and FIG. 7B is a cross-sectional view of the pattern for positioning in the fifth embodiment of the semiconductor device of the present invention, respectively, while

DETAILED DESCRIPTION OF THE PREFERRED EMBODIMENTS

A fuse element for laser trimming, a pattern for laser trimming positioning, a high speed MOS transistor of a complete depletion type, a high withstand voltage type MOS transistor, an ESD protecting element and a bleeder resistor formed of a plurality of resistors are formed in a semiconductor integrated circuit formed on an SOI substrate.

The pattern for laser trimming positioning is composed of a high light reflectivity region and a low light reflectivity region. The high light reflectivity region is formed of a high light reflectivity film formed on a flat base. The low light reflectivity region is formed of a high light reflectivity film formed on a grid, stripe or dot pattern that is for causing diffused reflection of light and is formed of the same thin film as the fuse element for laser trimming.

The fuse element for laser trimming and the bleeder resistor region are formed of a monocrystal silicon device forming layer on the SOI substrate.

Further, the high speed MOS transistor of a complete depletion type is formed in the monocrystal silicon device forming layer. The high withstand voltage type MOS transistor and the ESD protecting element are formed on the silicon substrate from which the monocrystal silicon device forming layer on the SOI substrate and a buried oxide film are removed.

Further, the monocrystal silicon device forming layer and the buried oxide film are removed from a scribe region of the semiconductor integrated circuit.

Thus, a semiconductor device having an analog IC of high accuracy which mixedly has the high speed MOS transistor of a complete depletion type and the high withstand voltage type MOS transistor on the SOI substrate can be provided, so that the semiconductor device is strong against ESD breakdown and cracking, breakage, etc., are prevented in a dicing process.

In particular, the pattern for laser trimming positioning is composed of the high light reflectivity region and the low light reflectivity region. The high light reflectivity region is formed of a high light reflectivity film formed on a flat base. The low light reflectivity region is formed of a high light reflectivity film formed on a grid, stripe or dot pattern that is for causing diffused reflection of light and is formed of the same monocrystal silicon device forming layer as the fuse element for laser trimming. Accordingly, the boundary of the high light reflectivity region and the low light reflectivity region, i.e., a place where light reflectivity sharply is changed is defined by a pattern formed of the same monocrystal silicon device forming layer as the fuse element for laser trimming. Thus, laser trimming can be accurately performed without being influenced by a shift in alignment in a wafer process.

Figure 1:
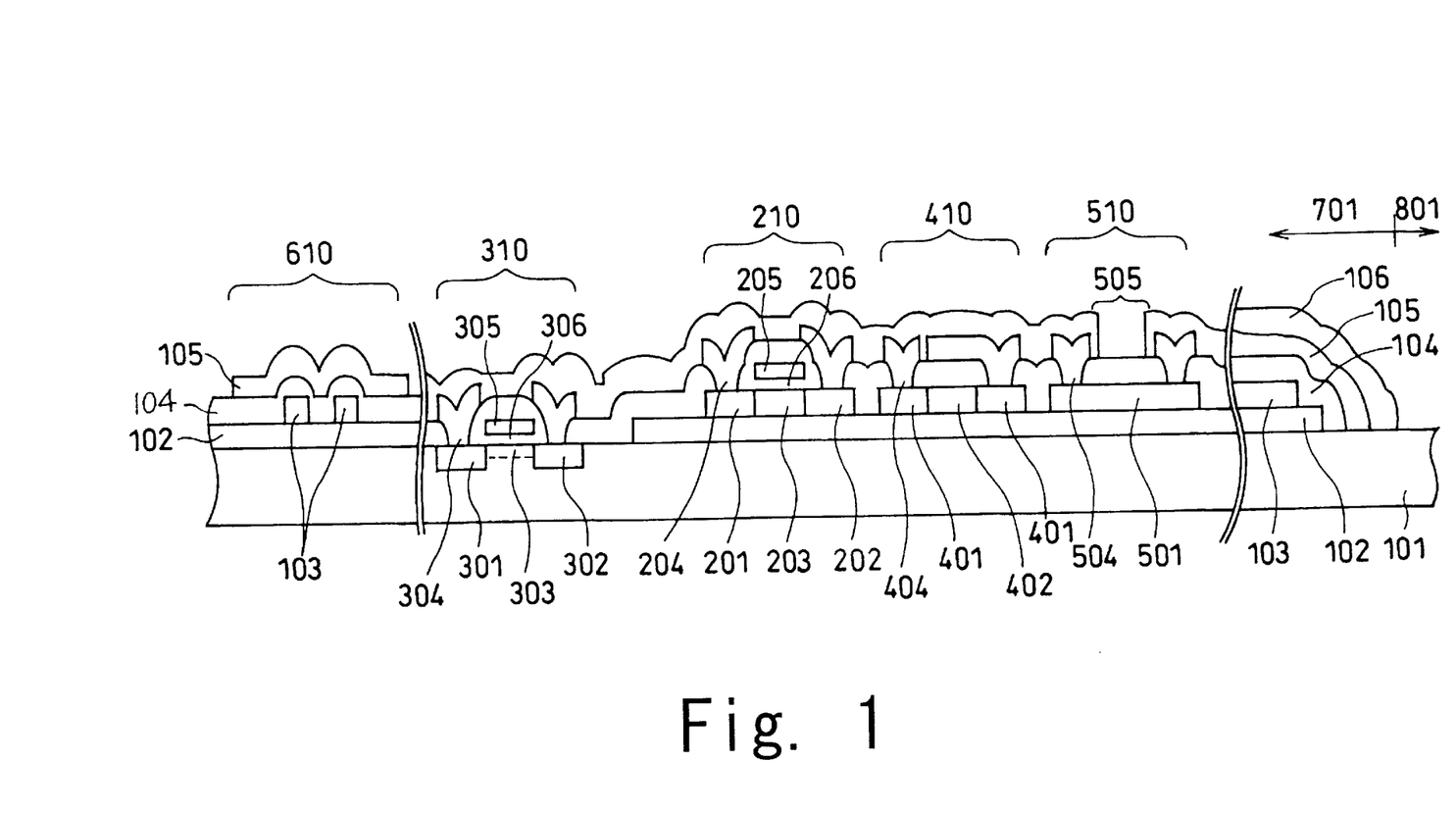
FIG. 1 is a sectional view schematically showing a semiconductor device of the present invention.

Embodiments of the present invention will next be explained with reference to the drawings. FIG. 1 is a sectional view schematically showing a semiconductor device of the present invention. A description will be given in order on each region with reference to FIG. 1.

A region 210 for a high speed MOS transistor of a complete depletion type will first be explained. A source region 201, a drain region 202 and a channel region 203 are formed within a monocrystal silicon device forming layer 103 formed on a silicon substrate 101 through a buried oxide film 102. Further, a gate electrode 205 is arranged above the channel region 203 through a gate oxide film 206 so that a transistor of a MOS type is formed. Here, the monocrystal silicon device forming layer 103 is set to, for example, 500 angstroms in thickness for the purpose of complete depletion.

Further, an aluminum film 105 is connected to the source region 201 and the drain region 202 through a contact hole 204 opened in an intermediate insulating film 104 formed of a BPSG film, etc. A protective film 106 is formed in the uppermost layer in the high speed MOS transistor region 201 and is formed of a silicon nitride film, etc.

Here, an electric potential of the channel region 203 may be set to a floating electric potential, or may be set to a fixed electric potential in a certain case. The source region 201 and the drain region 202 are desirably formed such that bottom sides of these regions come in contact with the buried oxide film 102, in order to reduce capacity. However, the source region 201 and the drain region 202 may be also formed to have depths set such that a depletion layer comes in contact with the buried oxide film 102 at a voltage application time. Further, the source region 201 and the drain region 202 may be spaced apart from the buried oxide film 102 if they are formed in such a depth as a depletion layer is brought into contact with the oxide film 102 when the voltage is applied.

A high withstand voltage MOS transistor and an ESD protecting circuit region 310 will next be explained. A source region 301, a drain region 302 and a channel region 303 are formed on the silicon substrate 101. A gate electrode 305 is arranged above the channel region 303 through a gate oxide film 306, thereby forming a transistor of a MOS type.

Further, the aluminum film 105 is connected to the source region 301 and the drain region 302 through a contact hole 304 opened in an intermediate insulating film 104 formed for example of a BPSG film. Similar to the high speed MOS transistor region 210, the protective film 106 formed of a silicon nitride film, etc. is formed also in the uppermost layer in the high withstand voltage MOS transistor and the ESD protecting circuit region 310.

Here, unlike the high speed MOS transistor region 210, the high withstand voltage MOS transistor and the ESD protecting circuit region 310 are characterized in that the monocrystal silicon device forming layer 103 and the buried oxide film 102 are removed and elements are directly formed on the silicon substrate 101. Thus, it is possible to easily form the high withstand voltage MOS transistor suitable for high operating voltages of a DDD structure, a LOCOS drain structure, etc. although these structures are not particularly illustrated. The gate oxide film 306 may be thicker in comparison with the gate oxide film 206 of the high speed MOS transistor region 210. Though not shown particularly, an off transistor, a diode, etc. having heat capacity and a junction region capable of providing a sufficient resisting property against ESD may be formed by forming the ESD protecting circuit on the silicon substrate 101.

A bleeder resistor region 410 will next be explained. A low concentration impurity region 402 is interposed between a pair of high concentration impurity regions 401 within the monocrystal silicon device forming layer 103 formed on the silicon substrate 101 through the buried oxide film 102, forming a resistor. Here, for brevity, only one resistor is illustrated, but the bleeder resistor is formed of a plurality of resistors in actuality.

Further, the aluminum film 105 is connected to the high concentration impurity region 401 through a contact hole 404 opened to an intermediate insulating film 104 formed of a BPSG film, for example. Here, the aluminum film 105 connected to one of high concentration impurity regions 401 is arranged so as to cover the low concentration impurity region 402 that determines a resistance value of the resistor, thereby stabilizing the resistance value.

This arrangement is used to prevent the resistance value of the resistor from being changed by the difference in electric potential between a conductor close to the resistor and the resistor itself. When all the plurality of resistors forming the bleeder resistor are similarly manufactured such that an electric potential of the aluminum film 105 above each of the resistors corresponds with not a power electric potential and a ground electric potential but with an electric potential at one end of this bleeder resistor, there is almost no difference in electric potential between the aluminum film 105 located above each resistor and the resistor itself so that each resistor processed in the same size and shape shows the same resistance value. Voltage can be divided with high accuracy by forming a bleeder resistor circuit by using such resistors.

Further, in the present invention, the resistor is formed of the monocrystal silicon device forming layer 103 itself in comparison with the bleeder resistor using the conventional polycrystal silicon thin film. Therefore, the influence of grain of the polycrystal silicon thin film can be removed so that a more uniform resistor can be obtained. Therefore, a bleeder resistor circuit with higher operational accuracy can be formed.

The description given here is the case of forming the resistor having a high resistance value and provided with the low concentration impurity region 402 that is interposed between the pair of high concentration impurity regions 401. However, the entire resistor may be formed of the high concentration impurity regions 401 in a use where no high resistance value is required. The protective film 106 formed of a silicon nitride film, etc., is formed in the uppermost layer in the bleeder resistor region 410.

A fuse region 510 will next be explained. A monocrystal silicon fuse 501 is formed within the monocrystal silicon device forming layer 103 formed on the silicon substrate 101 through the buried oxide film 102. The monocrystal silicon fuse 501 has a high impurity concentration to provide a good conductivity and reduce the resistance value as much as possible.

An aluminum film 105 is connected to each of the ends of the monocrystal silicon fuse 501 through a contact hole 504 opened to the intermediate insulating film 104 formed of a BPSG film, etc. A portion corresponding to a laser irradiated region 505 is removed from the protective film 106 formed of a silicon nitride film, etc. and formed in the uppermost layer in the fuse region 510. This portion is removed from the protective film 106 to prevent trouble in cutting the monocrystal silicon fuse 501 which is caused by absorption of energy of a laser beam irradiated at a laser trimming time into the protective film 106.

Figure 3A:
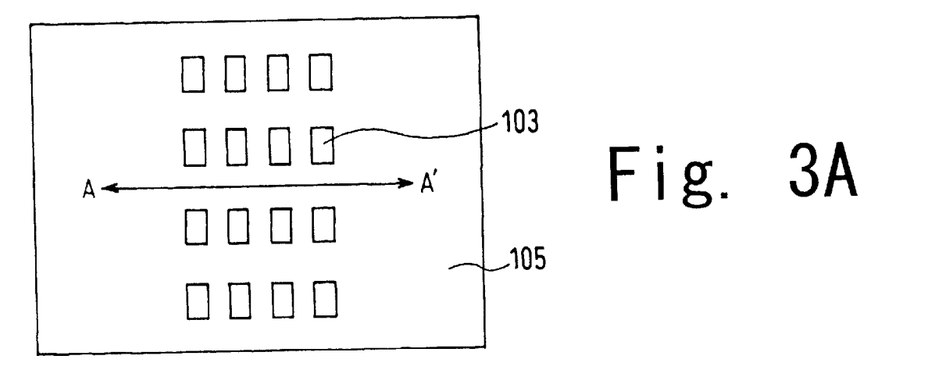
Figure 3B:
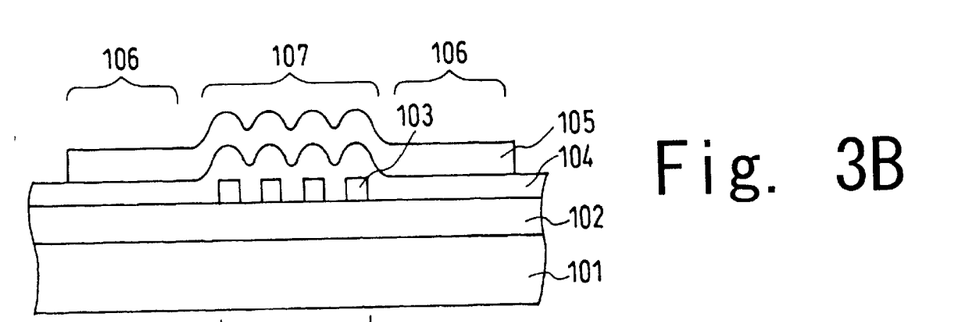
Figure 3C:
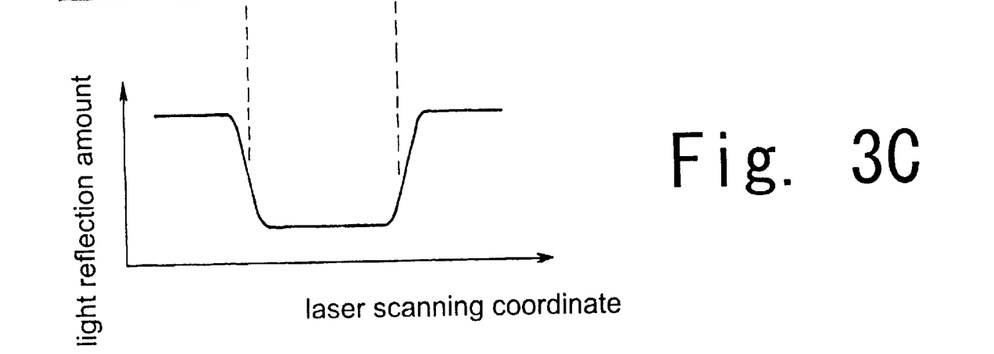
FIG. 3C is a graph showing a light reflection amount along the line A–A' of FIG. 3A.

A pattern region 610 for laser trimming positioning will next be explained. Here, the explanation is made with reference to FIGS. 3A to 3C in addition to FIG. 1. FIG. 3A is a plan view of a pattern for positioning in the semiconductor device of the present invention. FIG. 3B is a cross-sectional view of the pattern for positioning in the semiconductor device of the present invention. FIG. 3C is a graph showing a change in light reflection amount when the light beam is scanned over the pattern for positioning in the semiconductor device of the present invention. The light reflection amount is a value provided when the light beam is scanned along the direction of the line A–A' of FIG. 3A.

As shown in FIG. 3B, the positioning pattern in the present invention is composed of a high light reflectivity region 106 and a low light reflectivity region 107 inside this high light reflectivity region 106.

A structure of the positioning pattern of the present invention will be explained with reference to FIGS. 3A and 3B. A buried oxide film 102 is formed on a silicon substrate 101 and a monocrystal silicon device forming layer 103, a part of which is dot-like, is formed on the buried oxide film 102. The flat buried oxide film 102 is exposed in a region where the monocrystal silicon device forming layer 103 is not formed. An intermediate insulating film 104 formed of a BPSG film, etc. is formed on this exposed portion of the flat buried oxide film 102. An aluminum film 105 is formed on the intermediate insulating film 104. A surface of the aluminum film 105 located above the region where the dot-like monocrystal silicon device forming layer 103 is formed is uneven due to the influence of a pattern of the monocrystal silicon device forming layer 103. Accordingly, light irradiated to this uneven portion is diffusely reflected. This region may thus serve as a low light reflectivity region 107. On the other hand, the surface of the aluminum film 105 on the region where the monocrystal silicon device forming layer 103 is not formed is flat and may serve as a high light reflectivity region 106.

As shown in FIG. 3C, when the light beam is scanned along the direction of the line A–A' of FIG. 3A, a light reflection amount is large in the high light reflectivity region 106 formed of the aluminum film 105 having the flat surface and is small in the low light reflectivity region 107 formed of the aluminum film 105 having the uneven surface.

In the examples of FIGS. 3A, 3B and 3C, the low light reflectivity region 107 is formed by utilizing a diffused reflection action of light. The pattern of a dot shape is formed of the monocrystal silicon device forming layer 103 as the same thin film as the monocrystal silicon fuse 501 to cause the diffused reflection of light. Diffused reflection of light may also be caused by a grid, stripe, or other pattern in addition to the dot pattern, and a light reflecting pattern as shown in FIG. 3C is obtained.

The intermediate insulating film 104 in FIG. 3B is not necessarily required. Accordingly, this intermediate insulating film 104 may be omitted in some cases. Further, a metallic material such as tungsten, chromium, gold, etc. may be used as a high light reflectivity film instead of the aluminum film 105.

As mentioned above, the boundary of the high light reflectivity region 106 and the low light reflectivity region 107 is determined by the pattern of the monocrystal silicon device forming layer 103 that is the same thin film as the monocrystal silicon fuse 501. Therefore, it is possible to solve the conventional problem of the positioning pattern in which the polycrystal silicon forming the fuse element and the aluminum film forming the positioning pattern are not aligned but are shifted from each other.

Figure 4A:
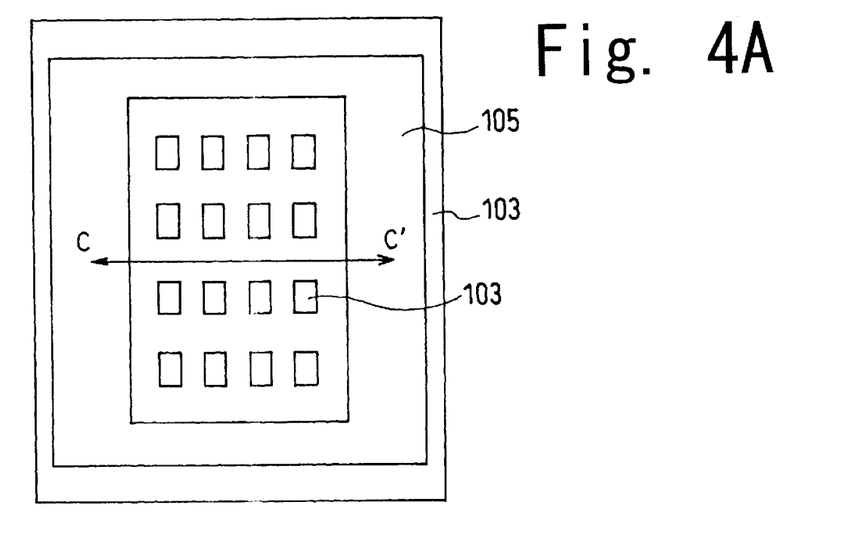
Figure 4B:
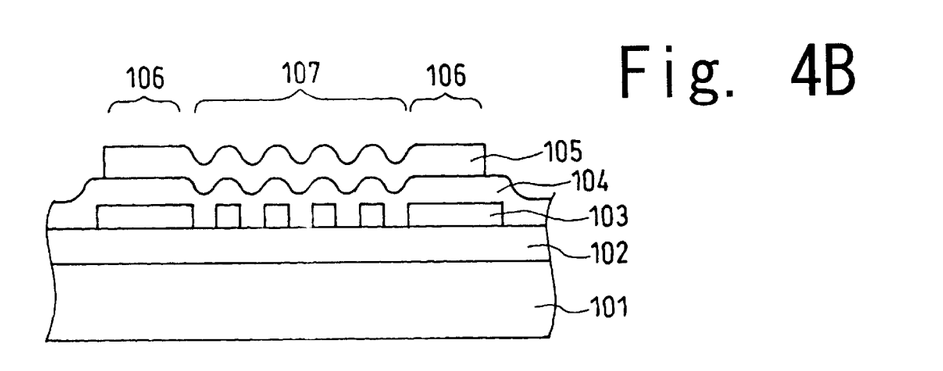
Figure 4C:
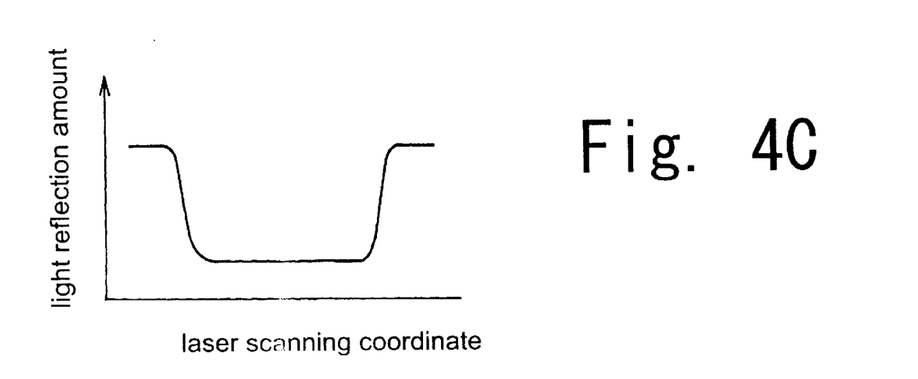
FIG. 4C is a graph showing a light reflection amount along the line C–C' of FIG. 4A.

FIG. 4A is a plan view of a pattern for positioning in a second embodiment of the semiconductor device of the present invention. FIG. 4B is a cross-sectional view of the pattern for positioning in the second embodiment of the semiconductor device of the present invention. FIG. 4C is a graph showing a change in light reflection amount when a light beam is scanned over the pattern for positioning in the second embodiment of the semiconductor device of the present invention. The light reflection amount is a value provided when the light beam is scanned along the direction of the line C–C' of FIG. 4A. Similar to the first embodiment shown in FIGS. 3A to 3C, the pattern for positioning in the second embodiment of the present invention is composed of a high light reflectivity region 106 and a low light reflectivity region 107 inside this high light reflectivity region 106.

The second embodiment differs from the first embodiment in that the high light reflectivity region 106 is formed of an aluminum film 105 located above a flat monocrystal silicon device forming layer 103. If the high light reflectivity region 106 is formed of a high light reflectivity film on a flat base, a function of this high light reflectivity region 106 can be fulfilled so that such a construction can be also used. The explanations of the other parts are omitted here by denoting them with the same reference numerals as FIGS. 3A to 3C.

Figure 5A:
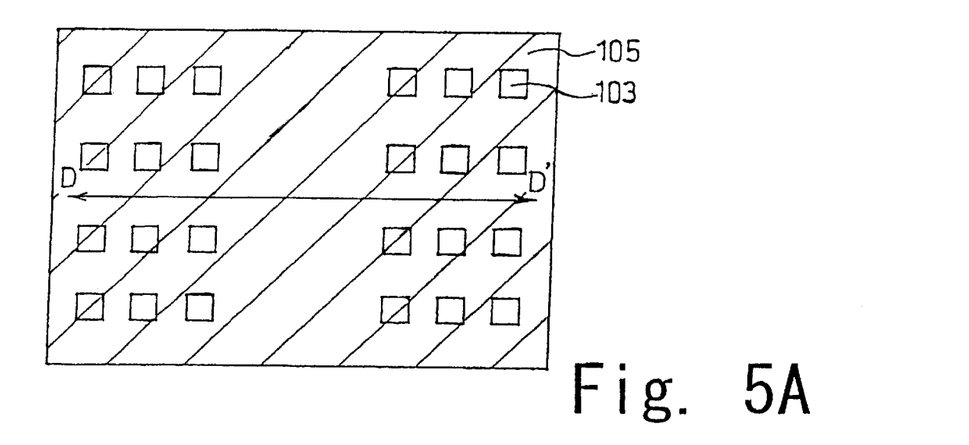
Figure 5B:
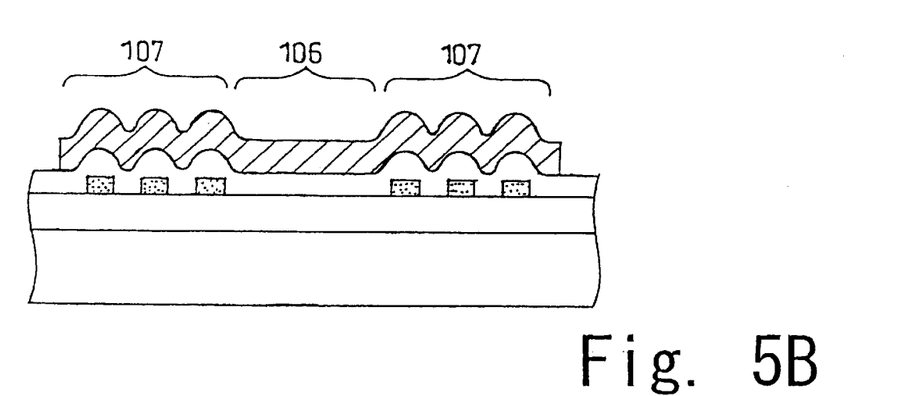
Figure 5C:
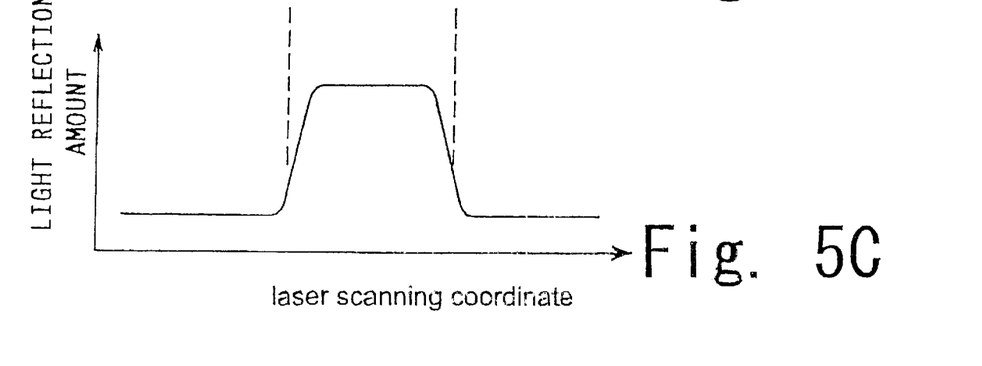
FIG. 5C is a graph showing a light reflection amount along the line D–D' of FIG. 5A.

FIG. 5A is a plan view of a pattern for positioning in a third embodiment of the semiconductor device of the present invention. FIG. 5B is a cross-sectional view of the pattern for positioning in the third embodiment of the semiconductor device of the present invention. FIG. 5C is a graph showing a change in light reflection amount when a light beam is scanned over the pattern for positioning in the third embodiment of the semiconductor device of the present invention. The light reflection amount is a value provided when the light beam is scanned along the direction of the line D–D' of FIG. 5A. The pattern for positioning in the third embodiment of the present invention takes the structure in which a low light reflectivity region 107 is arranged on an outer side while a high light reflectivity region 106 is arranged inside this low light reflectivity region 107. It is sufficient to form the pattern for positioning if one of the high light reflectivity region 106 and the low light reflectivity region 107 is interposed between the other light reflectivity regions. The third embodiment shown in FIGS. 5A to 5C shows that the present invention may also take an inverted arrangement of that of the first embodiment shown in FIGS. 3A to 3C. The explanations of the other parts are omitted here by denoting them with the same reference numerals as FIGS. 3A to 3C.

Figure 6A:
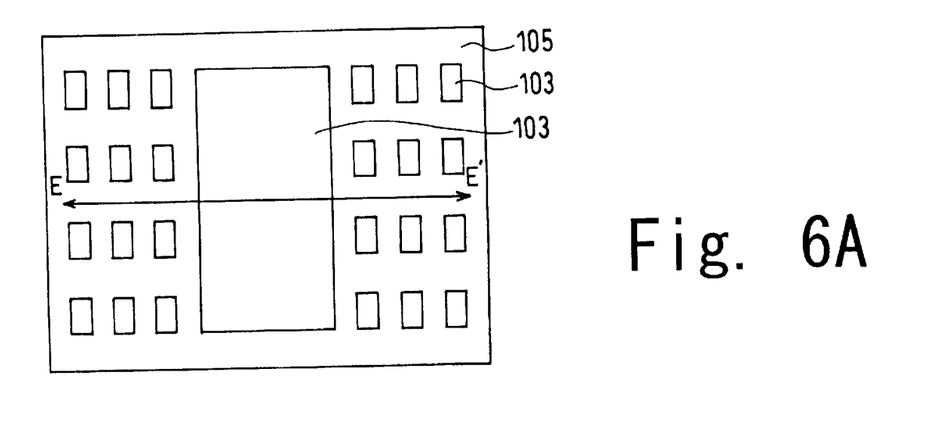
FIGS. 6A and 6B are diagrams showing a plan view of a pattern for positioning in a fourth embodiment of the semiconductor device of the present invention and a cross-sectional view of the pattern for positioning in the fourth embodiment of the semiconductor device of the present invention, respectively.
Figure 6B:
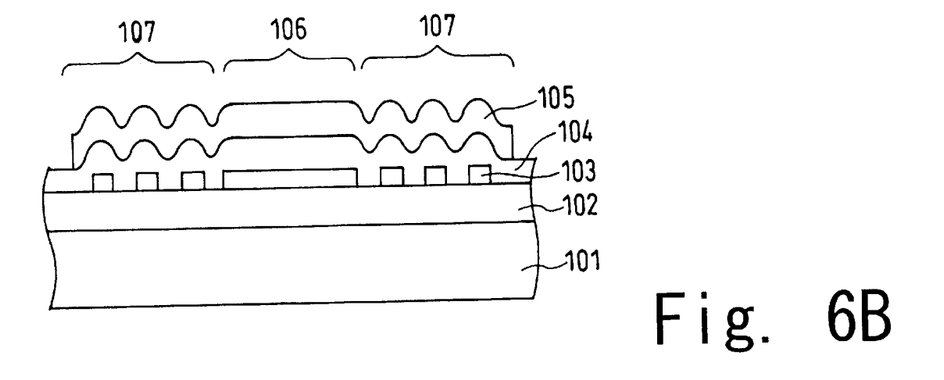
Figure 6C:
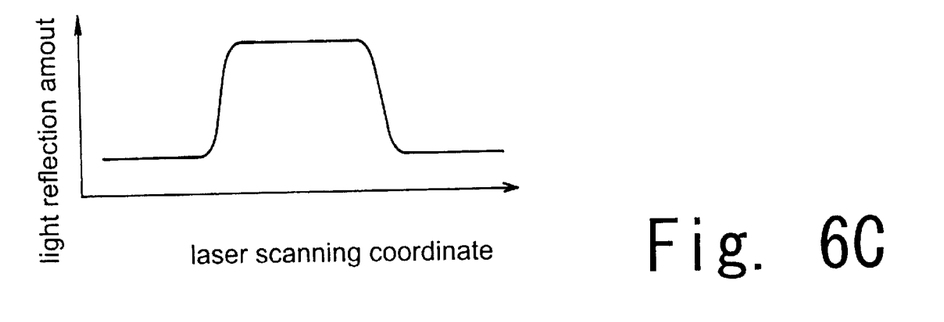
FIG. 6C is a graph showing a light reflection amount along the line E–E' of FIG. 6A.

FIG. 6A is a plan view of a pattern for positioning in a fourth embodiment of the semiconductor device of the present invention. FIG. 6B is a cross-sectional view of the pattern for positioning in the fourth embodiment of the semiconductor device of the present invention. FIG. 6C is a graph showing a change in light reflection amount when a light beam is scanned over the pattern for positioning in the fourth embodiment of the semiconductor device of the present invention. The light reflection amount is a value provided when the light beam is scanned along the direction of the line E–E' of FIG. 6A. The pattern for positioning in the fourth embodiment of the present invention takes the structure in which a low light reflectivity region 107 is arranged on an outer side while a high light reflectivity region 106 is arranged inside this low light reflectivity region 107.

Similar to the explanation in the third embodiment, it is sufficient if the pattern for positioning if formed such that one of the high light reflectivity region 106 and the low light reflectivity region 107 is interposed between the other light reflectivity regions. The fourth embodiment shown in FIGS. 6A to 6C shows an inverted arrangement of that of the second embodiment shown in FIGS. 4A to 4C. The explanations of the other parts are omitted here by denoting them with the same reference numerals as FIGS. 3A to 3C.

Figure 7A:
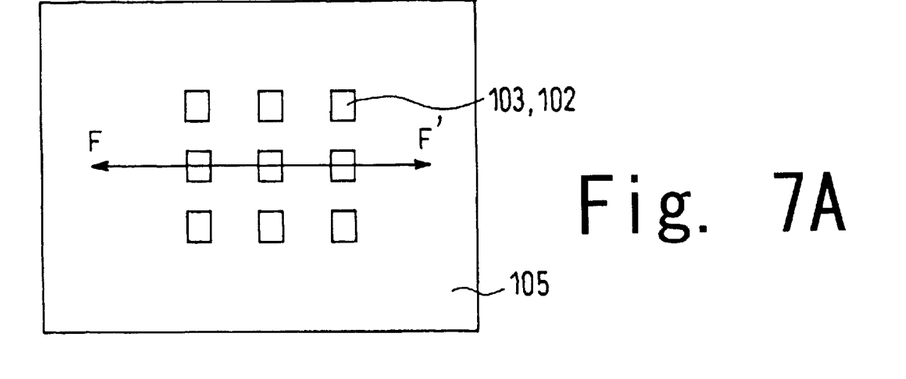
Figure 7B:
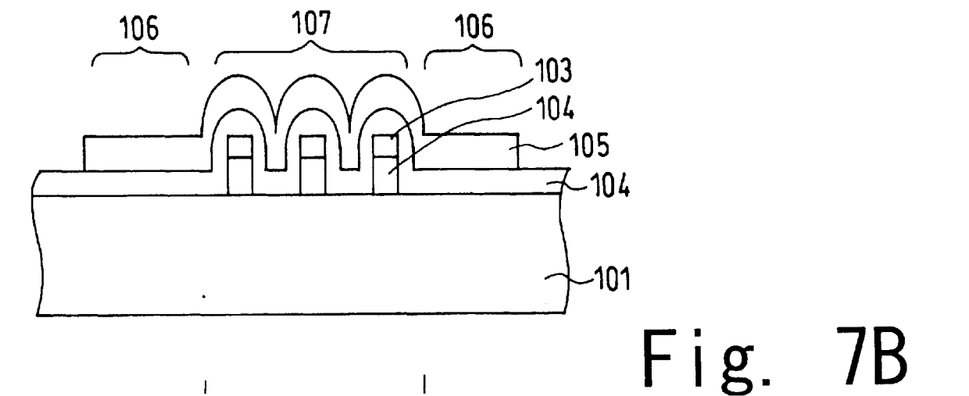
Figure 7C:
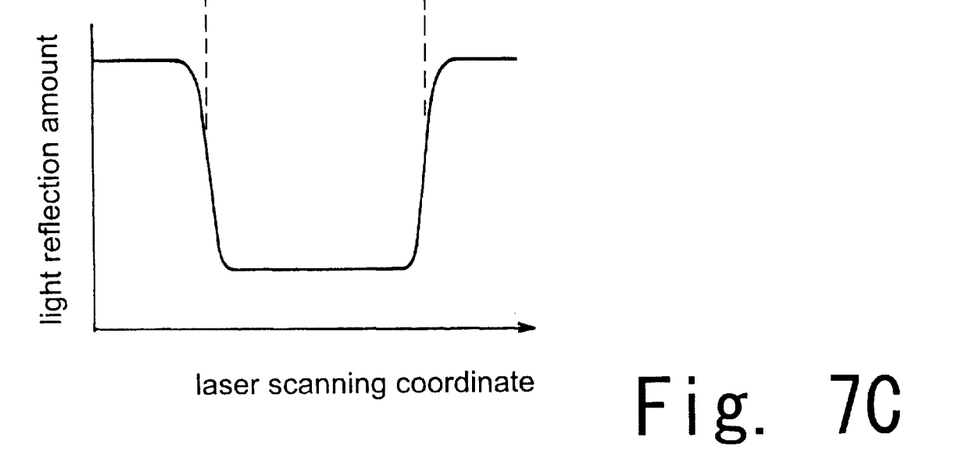
FIG. 7C is a graph showing a light reflection amount along the line F–F' of FIG. 7A.

FIG. 7A is a plan view of a pattern for positioning in a fifth embodiment of the semiconductor device of the present invention. FIG. 7B is a cross-sectional view of the pattern for positioning in the fifth embodiment of the semiconductor device of the present invention. FIG. 7C is a graph showing a change in light reflection amount when a light beam is scanned over the pattern for positioning in the fifth embodiment of the semiconductor device of the present invention. The light reflection amount is a value provided when the light beam is scanned along the direction of the line F–F' of FIG. 7A.

In the fifth embodiment of the present invention, a buried oxide film 102 and a dot-like monocrystal silicon device forming layer 103 of a dot shape are formed in alignment with each other. Since a dot is formed of a composite film of the monocrystal silicon device forming layer 103 and the buried oxide film 102, the dot is increased in height in comparison with the one in the first embodiment and unevenness of the surface of an aluminum film 105 located above a region where the monocrystal silicon device forming layer 103 region is not formed is also increased in degree. Therefore, light irradiated to this uneven portion is more diffusely reflected in comparison with the first embodiment so that light reflectivity is further reduced.

As shown in FIG. 7C, when the light beam is scanned along the direction of the line F–F' of FIG. 7A, the light reflection amount is large in a high light reflectivity region 106 formed of the aluminum film 105 having the flat surface and is small in a low light reflectivity region 107 formed of the aluminum film 105 having the uneven surface.

Here, since the dot is formed of the composite film of the monocrystal silicon device forming layer 103 and the buried oxide film 102, the height of the dot is high and light reflectivity of the low light reflectivity region 107 can be further reduced. Therefore, the difference (contrast) in light reflectivity between the low light reflectivity region 107 and the high light reflectivity region 106 can be increased. Thus, the positioning operation is not easily influenced by an external factor at the time of positioning in the laser scan and can be more accurately performed.

The fifth embodiment shows an example in which the dot is increased in height on the basis of the first embodiment. However, the dot height can be similarly increased with respect to the second to fourth embodiments, which is also effective. Further, similar effects are obtained also when the pattern is stripe-like, or grid-like, without being limited to the dot pattern.

The explanations of the other parts are omitted here by denoting them with the same reference numerals as FIGS. 3A to 3C.

Figure 9:
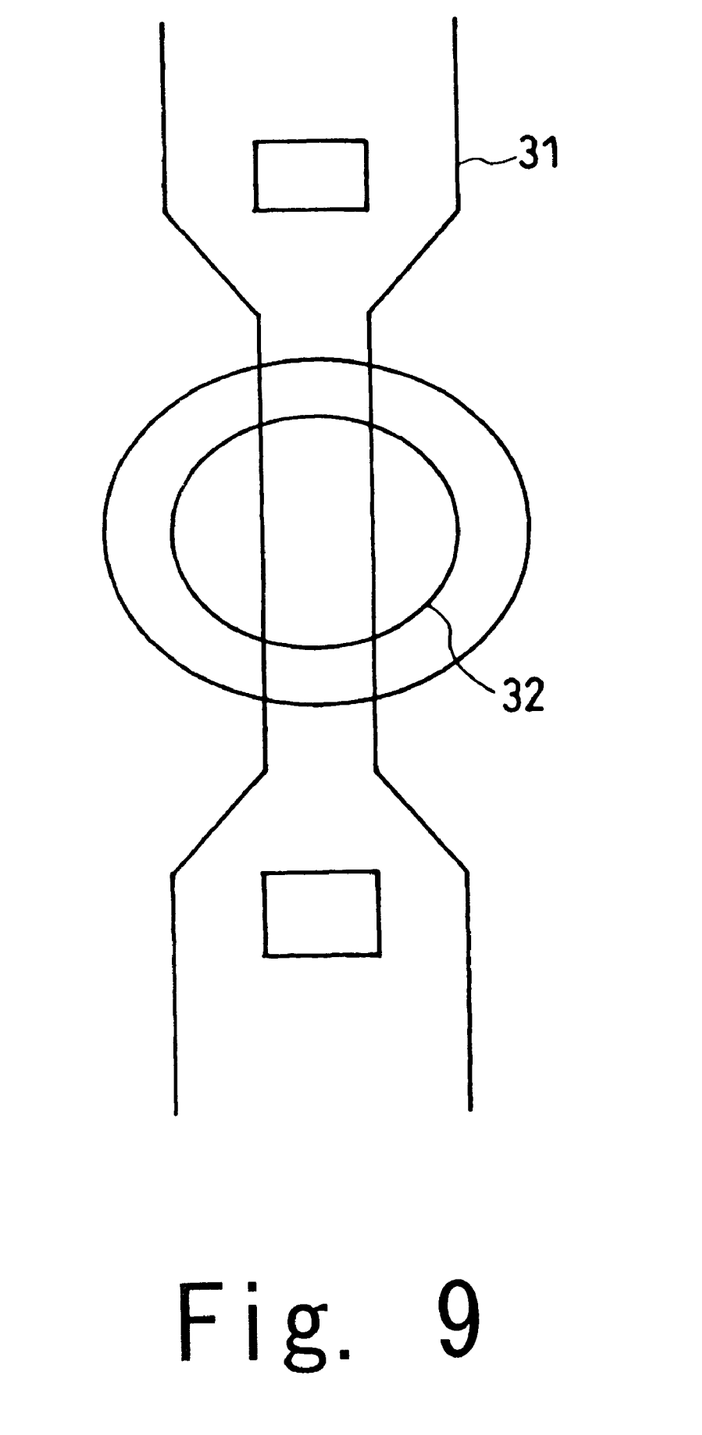
FIG. 9 is a plan view of a fuse element of the semiconductor device of the present invention.

FIG. 9 is a plan view of a fuse element laser-trimmed by using the pattern for positioning in the semiconductor device of the present invention. The irradiation can be made with a laser spot 32 set in the center of the fuse element 31.

Figure 10:
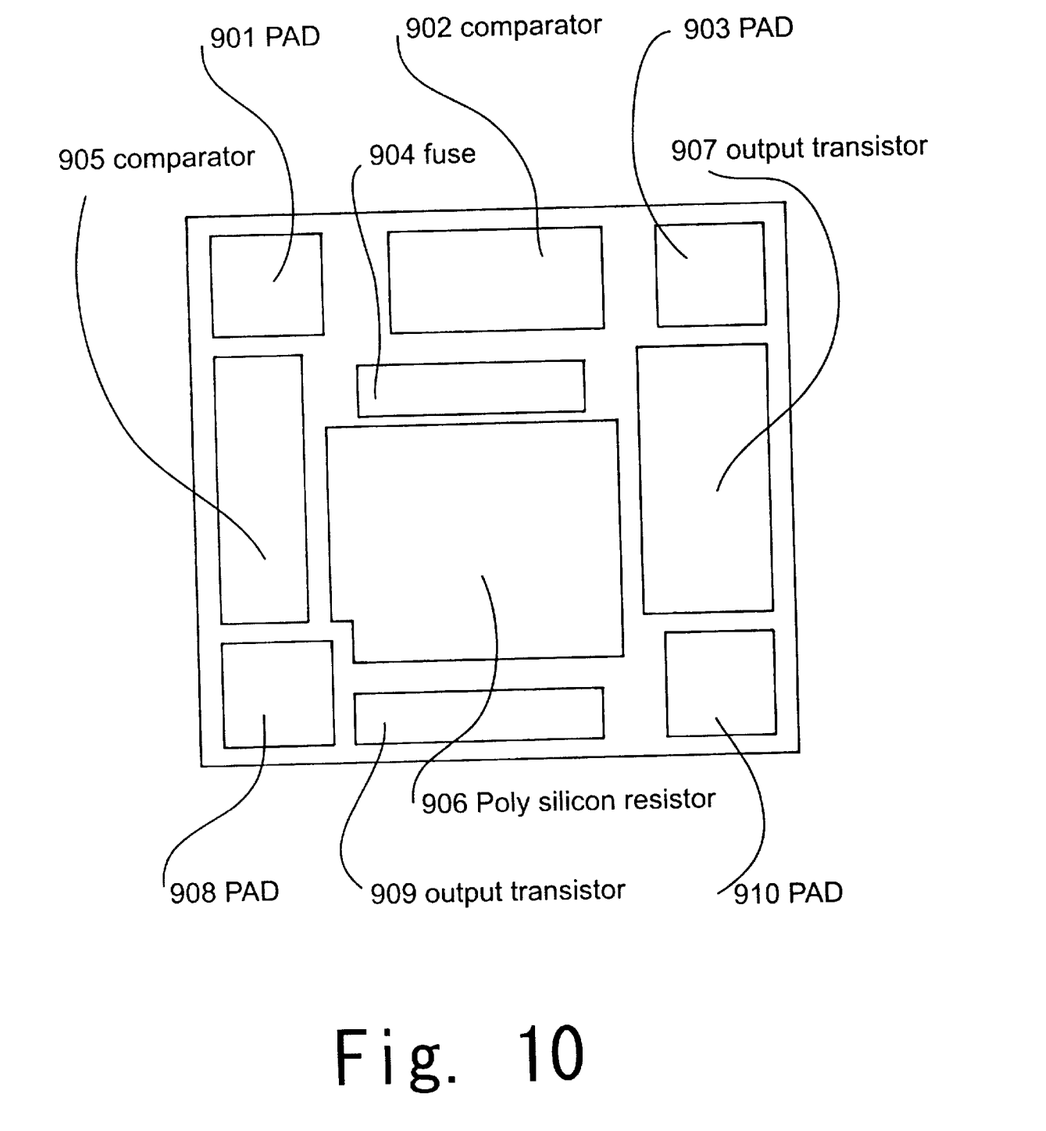
FIG. 10 is a block diagram showing the semiconductor device of the present invention.

The semiconductor device of the present invention is very suitable for a semiconductor integrated circuit composed of a semiconductor element large in fluctuation. For example, FIG. 10 is a block diagram of an IC for voltage detection, comprises a PAD 901, comparator 902, PAD 903, fuse 904, comparator 905, poly silcon resistor 906, output transistor 907, PAD 908, output transistor 909, and PAD 910, including a MOS transistor of high withstand voltage. The fluctuation of a MOSIC in analog characteristics is large in comparison with a bipolar IC. In particular, in the case of high withstand voltage characteristics, the fluctuation of the analog characteristics is further increased because of a gate insulating film with an increased thickness. Accordingly, in the case of the analog MOSIC, a large fuse region is required as shown in FIG. 10. Analog characteristics having small fluctuation can be obtained by arranging ten fuse elements or more.

Each of the fuse elements can be reduced in size by using the pattern for positioning in the present invention. Further, the fuse elements can be arranged in two places or more in the same plane in different directions.

The pattern for positioning in the present invention can be formed in one of the interior of scribe lines, the interior of a semiconductor chip and the interior of a TEG chip. When the pattern for positioning is arranged within the scribe lines or the TEG chip, an area of the semiconductor chip can be reduced.

The present invention is suitable for the analog MOSIC, but can be also used in a digital IC. Further, the present invention is also suitable for the realization of an analog bipolar IC of high density, and very small in fluctuation.

In FIGS. 3A to 7C used to explain the pattern region 610 for laser trimming positioning, the intermediate insulating film 104 is not necessarily required. Accordingly, the intermediate insulating film 104 may be omitted in some cases. Further, a metallic material such as tungsten, chromium, gold, etc. may be used instead of the aluminum film 105 as a high light reflectivity film.

A scribe region 801 will next be explained. In FIG. 1, a cutting margin in a later dicing process (a cut-out process of an IC chip) is the scribe region 801. The scribe region 801 is started from an end of a semiconductor integrated circuit internal region 701. Here, a monocrystal silicon device forming layer 103 and a buried oxide film 102 are removed from the scribe region 801. As shown in FIG. 1, desirably, an intermediate insulating film 104, an aluminum film 105, a protective film 106, etc. are also removed from the scribe region 801.

The reasons for this regions follows. Namely, when the scribe region 801 serving as a cutting margin in the dicing process and the semiconductor integrated circuit internal region 701 are connected to each other by the continuous monocrystal silicon device forming layer 103 and damaging force causing cracking, breakage, etc., is applied due to the fluctuation in the dicing process, the cracking, breakage, etc. are transmitted also to the semiconductor integrated circuit internal region 701, so that an important IC is broken or a defect in operation of the IC chip is caused. Therefore, the intermediate insulating film 104, etc. are desirably removed from the scribe region 801 to prevent such problems from being caused.

In particular, in the IC made on the SOI substrate, the thin buried oxide film 102 and the monocrystal silicon device forming layer 103 are formed on the silicon substrate 101. Therefore, attention is required since the cracking, breakage, etc., are easily caused in the buried oxide film 102 and the monocrystal silicon device forming layer 103 which are upper layers.

It is important in the prevention of the cracking and the breakage of the IC chip that the same continuous film is not left between the scribe region 801 serving as a cutting margin in the dicing process and the semiconductor integrated circuit internal region 701 to be an IC chip. In particular, with respect to the IC formed on the SOI substrate, as shown in FIG. 1, it is necessary to remove the monocrystal silicon device forming layer 103 and the buried oxide film 102 from the scribe region 801. As shown in FIG. 1, it is more desirable to further remove the intermediate insulating film 104, the aluminum film 105, the protective film 106, etc. When it is necessary to form various kinds of marks, a test pattern, etc. in the scribe region 801, it is preferable to once form a region from which pertinent films are removed in an area between the scribe region 801 and the semiconductor integrated circuit internal region 701 so as not to continuously connect the scribe region 801 and the semiconductor integrated circuit internal region 701 to each other by the same film.

A fuse element for laser trimming, a pattern for laser trimming positioning, a high speed MOS transistor of a complete depletion type, a high withstand voltage type MOS transistor, an ESD protecting element and a bleeder resistor formed of a plurality of resistors are formed in a semiconductor integrated circuit formed on an SOI substrate in the present invention.

The pattern for laser trimming positioning is composed of a high light reflectivity region and a low light reflectivity region. The high light reflectivity region is formed of a high light reflectivity film formed on a flat base. The low light reflectivity region is formed of a high light reflectivity film formed on a grid, stripe or dot pattern that is for causing diffused reflection of light and is formed of the same thin film as the fuse element for laser trimming.

The fuse element for laser trimming and the breeder resistor are formed of a monocrystal silicon device forming layer on the SOI substrate.

Further, the high speed MOS transistor of a complete depletion type is formed in the monocrystal silicon device forming layer. The high withstand voltage type MOS transistor and the ESD protecting element are formed on the silicon substrate from which the monocrystal silicon device forming layer on the SOI substrate and a buried oxide film are removed.

On the other hand, the monocrystal silicon device forming layer and the buried oxide film are removed from a scribe region of the semiconductor integrated circuit.

Thus, a semiconductor device having an analog IC of high accuracy which mixedly has the high speed MOS transistor of a complete depletion type and the high withstand voltage type MOS transistor on the SOI substrate can be provided, so that the semiconductor device is strong against ESD breakdown and cracking, breakage, etc., are prevented in a dicing process.

In particular, the pattern for laser trimming positioning is composed of the high light reflectivity region and the low light reflectivity region. The high light reflectivity region is formed of a high light reflectivity film formed on a flat base. The low light reflectivity region is formed of a high light reflectivity film formed on a grid, stripe or dot pattern that is for causing diffused reflection of light and is formed of the same thin film as the fuse element for laser trimming. Accordingly, the boundary of the high light reflectivity region and the low light reflectivity region, i.e., a place where light reflectivity is sharply changed is defined by a pattern formed of the same monocrystal silicon device forming layer as the fuse element for laser trimming. Thus, the laser trimming can be accurately performed without being influenced by a shift in alignment in a wafer process.

What is claimed is:

1. A semiconductor integrated circuit device comprising: a semiconductor substrate having a silicon-on-insulator (SOI) region and a bulk region; a fuse element for adjusting an analog characteristic of the semiconductor integrated circuit device and comprised of a monocrystal silicon layer formed in the SOI region of the semiconductor substrate; a laser trimming positioning pattern formed in the SOI region of the semiconductor substrate for facilitating trimming of the fuse element, the laser trimming positioning pattern having a high light reflectivity region and a low light reflectivity region comprised of a high light reflectivity film formed of the monocrystal silicon layer; a high speed MOS transistor of a complete depletion type formed in the SOI region of the semiconductor substrate; a high withstand voltage type MOS transistor formed in the bulk region of the semiconductor substrate and electrically connected to the high speed MOS transistor; an electrostatic discharge (ESD) protection element disposed in the bulk region of the semiconductor substrate; and a bleeder resistor comprised of a plurality of resistors disposed in the SOI region of the semiconductor substrate.

2. A semiconductor integrated circuit device according to claim 1; wherein the high light reflectivity film has a grid, stripe or dot pattern for causing diffused reflection of light.

3. A semiconductor integrated circuit device according to claim 1; wherein the breeder resistor is formed of a monocrystal silicon device forming layer.

4. A semiconductor integrated circuit device comprising: a semiconductor substrate having a silicon-on-insulator (SOI) region and a bulk region; a monocrystal silicon device forming layer formed in the SOI region of the semiconductor substrate; a laser-trimmable fuse element for adjusting an analog characteristic of the semiconductor integrated circuit device and formed of the monocrystal silicon device forming layer; a laser trimming positioning pattern formed in the SOI region of the semiconductor substrate for facilitating trimming of the fuse element, the laser trimming positioning pattern having a high light reflectivity region and a low light reflectivity region comprised of a high light reflectivity film formed of the monocrystal silicon device forming layer; a high speed MOS transistor of a complete depletion type formed in the SOI region of the semiconductor substrate; and a high withstand voltage type MOS transistor and an electrostatic discharge (ESD) protection element disposed in the bulk region of the semiconductor substrate and electrically connected to the high speed MOS transistor to prevent electrostatic breakdown of the monocrystal silicon device forming layer.

5. A semiconductor integrated circuit device according to claim 4; further comprising a bleeder resistor disposed in the SOI region of the semiconductor substrate.

6. A semiconductor integrated circuit device according to claim 5; wherein the bleeder resistor is formed of the monocrystal silicon device forming layer.

7. A semiconductor integrated circuit device according to claim 4; wherein the monocrystal silicon device forming layer has a thickness of about 1000 angstroms or less.

8. A semiconductor integrated circuit device according to claim 7; wherein the monocrystal silicon device forming layer is formed over a buried oxide film.

9. A semiconductor integrated circuit device according to claim 8; wherein the monocrystal silicon device forming layer and the buried oxide film are removed from a scribe region of the device.

10. A semiconductor integrated circuit device according to claim 9; wherein the high light reflectivity region of the laser trimming device is substantially flat; and wherein the low light reflectivity region of the laser trimming device is uneven and non-flat.

11. A semiconductor integrated circuit device according to claim 10; wherein the low light reflectivity region of the laser trimming device is comprised of a grid-, stripe- or dot-shaped region.

12. A semiconductor integrated circuit device according to claim 4; wherein the high light reflectivity region of the laser trimming device is substantially flat; and wherein the low light reflectivity region of the laser trimming device is uneven and non-flat.

13. A semiconductor integrated circuit device according to claim 4; wherein the low light reflectivity region of the laser trimming device is comprised of a grid-, stripe- or dot-shaped region.

14. A semiconductor integrated circuit device comprising: a silicon-on-insulator (SOI) substrate; a laser trimming positioning pattern disposed on the SOI substrate and composed of a high light reflectivity region and a low light reflectivity region, the high light reflectivity region being substantially flat, and the low light reflectivity region being uneven and non-flat and comprised of a high light reflectivity film formed of a monocrystal silicon layer; and a fuse element disposed on the SOI substrate and formed of the monocrystal silicon layer.

15. A semiconductor integrated circuit device according to claim 14; wherein the high light reflectivity film has a grid-, stripe or dot-shaped pattern region.

* * * * *